United States Patent [19]
Kodaira et al.

[11] Patent Number: 5,992,511
[45] Date of Patent: *Nov. 30, 1999

[54] COOLING APPARATUS FOR ELECTRONIC ELEMENT

[75] Inventors: Yuichi Kodaira; Nobumasa Kodama, both of Ueda; Toshiki Ogawara, Nagano-ken, all of Japan

[73] Assignee: Sanyo Denki Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/866,634

[22] Filed: May 30, 1997

[30] Foreign Application Priority Data

May 31, 1996 [JP] Japan ................................. 8-138333

[51] Int. Cl.$^6$ ............................................. F28F 7/00
[52] U.S. Cl. ................. 165/80.3; 165/185; 357/722; 361/697; 361/704; 361/709; 361/710
[58] Field of Search .................................. 165/80.3, 185, 165/121, 122; 361/690, 697, 696, 709, 710, 711, 707, 704, 703; 257/721, 722; 174/16.3

[56] References Cited

U.S. PATENT DOCUMENTS

| | | |
|---|---|---|
| 2,958,515 | 11/1960 | Booher, II ............................ 165/80.3 |
| 5,272,599 | 12/1993 | Koenen ............................ 165/80.3 X |
| 5,275,162 | 1/1994 | Crafts ............................ 165/80.3 X |
| 5,421,402 | 6/1995 | Lin . |
| 5,452,181 | 9/1995 | Hoover . |
| 5,484,013 | 1/1996 | Morikawa et al. . |
| 5,510,956 | 4/1996 | Suzuki ............................ 361/704 |
| 5,689,404 | 11/1997 | Katsui ............................ 165/80.3 X |

FOREIGN PATENT DOCUMENTS

| | | |
|---|---|---|
| 3-15982 | 4/1991 | Japan . |
| 404133451 | 5/1992 | Japan ............................ 257/722 |
| 405074987 | 3/1993 | Japan ............................ 257/722 |
| 7-111302 | 4/1995 | Japan . |

*Primary Examiner*—Christopher Atkinson
*Attorney, Agent, or Firm*—Pearne, Gordon, McCoy & Granger LLP

[57] ABSTRACT

A heating element cooling apparatus which is capable of improving the cooling efficiency without greatly increasing the overall weight thereof. A heat sink 2 for the heating element cooling apparatus is equipped with an air fan 1. A heat conducting element 3 having higher heat conductivity than a base 2a of the heat sink 2 is conductivity attached to the base 2a. Plural radiation fins 6 are mounted on an extended portion 3c of the heat conducting element 3 which extends exceeding the base 2a. The heat generated by a heating element 4, which is heat-conductively attached on the heat conducting element 3, is outwardly conducted toward the peripheral portion of the heat sink through the heat conducting element 3 and radiated from the radiation fins 2b, resulting in increasing the radiation efficiency.

3 Claims, 2 Drawing Sheets

COOLING APPARATUS FOR ELECTRONIC ELEMENT

BACK GROUND OF THE INVENTION

This invention relates to a cooling apparatus for a heating element, and more particularly to a heating element cooling apparatus for cooling a heating element such as an electronic element by the use of a heat sink which is equipped with an air fan.

A heating element cooling apparatus consisting of a heat sink and an air fan for cooling an electronic element, such as a central processing unit (CPU) or a micro processing unit (MPU) is disclosed in the publications of U.S. Pat. No. 5,484,013, U.S. Pat. No. 5,452,181, U.S. Pat. No. 5,421,402, Japanese Utility Model Publication No. 15982/1991 and Japanese Patent Laid-Open Publication No. 111302/1995. The heat sink conventionally used in the cooling apparatus for a heating element has been provided with a plurality of radiation fins on the front surface of a base and the heating element is provided on the rear side of the base. The air fan is positioned to blow the air toward the front surface of the base of the heat sink and the radiation fins.

The heating element provided at the rear side of the base of the heat sink rarely generates heat equally in all the portion of the element, but generally generates heat centering on one or more than one heat source or heating point. The central processing unit and the micro processing unit used in a microcomputer of the recent products especially tends to generate heat intensively centering on the heat sources. It has been a problem in cooling such a heating element having high heat density that the heat conduction from the heat sources to the outer portion of the heat sink is not easily made and cooling efficiency from the radiation fins positioned away from the heat sources decreases.

To solve the problem, an attempt to increase the thickness of the base of the heat sink has been employed to reduce the heat resistance toward the peripheral portion of the heat sink, however, another problem arises that it significantly increases the weight of the heat sink. The other attempt was to form a heat sink by a heat conductive material, such as copper or the liKe, in place of aluminum which is generally used, however, the problem arises that it significantly increases the overall weight of the heat sink if the whole heat sink is formed of a heat conductive material, such as copper or the like.

SUMMARY OF THE INVENTION

The present invention has been made in view of the foregoing disadvantage of the prior art.

Accordingly, it is an object of the present invention to provide a heating element cooling apparatus which is capable of increasing cooling efficiency without significantly increasing the weight.

It is another object of the present invention to provide a heating element cooling apparatus which is capable of increasing cooling efficiency by increasing radiation efficiency in the outer portion of the heat conducting element.

It is another object of the present invention to provide a heating element cooling apparatus which is capable of increasing cooling efficiency further by cooling the heat conducting element by the air blown out of the air fan.

It is another object of the present invention to provide a heating element cooling apparatus which is capable of increasing cooling efficiency, and occupies the reduced space for installation.

In accordance with the present invention, a heating element cooling apparatus is provided. This invention is intended for the apparatus including a heat sink which includes a plurality of radiation fins on a front surface of a base for cooling a heating element at a rear side of the base and radiates heat of the heating element from the base and the radiation fins, and an air fan for blowing air to the base and the radiation fins. The material and construction of the heat sink can be selectively decided. The construction of the air fan can also be selectively decided, however, an axial flow fan is preferable which draws air from one side along the axis of rotation of blades and discharges the air mainly to the other side along with the axis of rotation. To improve the cooling efficiency, the axial flow fan which discharges the air not only to the other side along the axis of rotation but forcibly to the radial directions of the rotation axis is more Preferable to be equipped. For this type of the axial flow fan, the heat sink and the air fan may be so arranged that the air discharged cut of the air fan flows out toward the outside of the base while cooling tie radiation fins.

In accordance with this invention, tho apparatus is further provided with a heat conducting element of higher heat conductivity than the base of the heat sink, heat-conductively fixed (conductively attached) on a rear side of the base. The description that the heat conducting element is "heat-conductively fixed" or "conductively attached" referred to in this specification is to mean that the heat conducting element is fixed or attached for enabling sufficient heat conduction from the heating element to the base of the heat sink through the heat conducting element. Such attachment or fixture includes a direct mounting of the heat conducting element on a rear surface of the base, and the fixing of the heat conducting element on the rear side of the base by means of, for example, an adhesive agent of high heat conductivity.

The construction of the heat conducting element for conducting the heat generated by the heating element to the outer end or the peripheral portion of the base can be selectively decided. For the most simplified structure, the heat conducting element may be attached to contact with the rear surface of the base generally in its entirety. Also, the heat conducting element may include a heat pipe construction which functions to uniform the temperature of the heat conducting element. In any apparatus in accordance with the present invention, the heat from one or more than one heat source of the heating element can be favorably conducted to the peripheral portion of the heat sink through the heat conducting element, so that, the radiation from the heat sink by cooling the heat sink with the air fan, or the cooling effect by the radiation fins can be efficiently improved. As the heat conducting element is intended to conduct heat from the heat source toward the rim of the base, the apparatus equipped with the heat conducting element is capable of avoiding increase of excessive weight compared with the apparatus the heat sink of which is all formed by a material of high conductivity. Adopting a heat conducting element which is provided with a heat pipe construction can further increase the cooling efficiency of the apparatus.

The heat value conveyed toward the rim of the base by the heat conducting element can he increased if the radiation efficiency in the outer portion of the heat conducting element is enhanced, which results in increasing the cooling efficiency. For this purpose, The heat conducting element is formed with an extended portion which outwardly extends exceeding the base of the heat sink. The extended portion is provided with plural radiation fins which are arranged to be exposed to the air discharged from the air fan. Thus, the radiation efficiency in the outer portion of the heat conducting element is enhanced, resulting in increasing the cooling efficiency of the apparatus. The heat conducting element can be comprised of a heating element attached area, to which the heating element is heat-conductively fixed or attached, and a heating element unattached area, which includes the extended portion, positioned outside of the heating element attached area. Further, a semiconductor cooling element, which absorbs heat from an endothermic surface and releases heat from a heat radiation surface when charged with electricity, can be heat-conductively attached to the heating element unattached portion to absorb heat from the heating element unattached portion. This structure further increases the radiation efficiency in the outer portion of the heat conducting element. Another heat sink with plural radiation fins for the semiconductor cooling element can be conductively attached on the endothermic surface of the element.

The installation space for the cooling apparatus must be increased when the heat conducting element is comprised of a heating element attached area, to which the heating element is heat-conductively attached, and a heating element unattached area, which includes the extended portion, positioned outside of the heating element attached area. However, the installation space can be reduced by forming the heat conducting element with a heating element attached area being thicker than a heat element unattached area and extending in the direction away from the base of the heat sink. In this structure, a gap or a space having a size as large as the size of the extension of the heating element attached area and a size of the height of the electronic element is formed under the heating element unattached area or the opposite side of the base. The carts or components positioned adjacent to the heating element can be received in this gap for saving space for installation as well as improving the cooling efficiency of the cooling apparatus.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, wherein.

DETAILED DESCRIPTION OF THE PREFERRED EMBODIMENT

Figure 1:
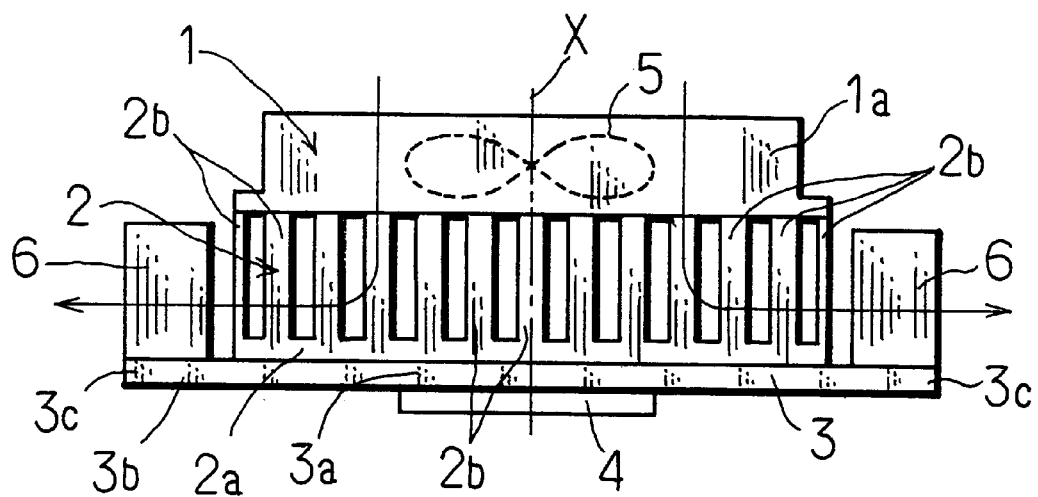
FIG. 1 is a schematic illustration showing a structure of an embodiment in which a heating element cooling apparatus in accordance with the present invention is applied to a cooling apparatus for cooling a heating electronic device such as a central processing unit or a micro processing unit.

A cooling apparatus for a heating element according to the present invention will be described hereinafter with reference to the accompanying drawings. FIG. 1 is a schematic illustration showing a structure of an embodiment in accordance with the present invention. Referring to FIG. 1, reference numeral 1 designates an air fan, 2 designates a heat sink, 3 designates a heat conducting element and 4 designates an electronic element as a heating element. The construction of a cooling apparatus in combination with the air fan 1 and the heat sink 2 is disclosed in a prior application filed by the applicant of this application, shown in the publication of Japanese Patent Laid-open Publication No. 111302/1995. The air fan is a type of an axial flow fan which draws air from one side along the axial direction of the axis X of rotation for rotating a plurality of blades 5 and discharges the air not only to the other side along the axial direction but forcibly to the radial directions of the rotation axis. The axial flow fan is arranged that a portion of a plurality of blades 5 projects out of a casing 1a but the portion is received within the heat sink 2, that is, the projected portion of the blades 5 is surrounded by radiation fins 2b of the heat sink 2.

The heat sink 2 includes a base 2a of a plate-like shape and a plurality of radiation fins 2b formed on a front surface of the base 2a. The radiation fins 2b are positioned outerly on the front surface of the base 2a to surround the portion of the blades 5 projected out of the casing 1a of the air fan 1. In the preferred embodiment of the present invention, the heat sink 2 is integrally formed of aluminum material molded in a die cast. The air fan 1 is threadedly fixed to the heat sink 2 by means of plural screws (not shown).

A heat conducting element 3 is formed of a copper plate which exhibits increased thermal conductivity compared with the base 2a of the heat sink 2. The heat conducting element 3 includes a heating element attached area 3a to which a heating element is heat-conductively attached on the opposite side to the base 2a of the heat sink 2 for facilitating the heat conduction, and a heating element unattached area 3b positioned outside of the heating element attached area 3a including an extended portion 3c extending outward beyond or exceeding the base 2a of the heat sink 2. The heat conducting element 3 is formed into a similar figure to the base 2a of the heat sink 2 with a larger size than the base 2a, and positioned concentric with the base 2a. Thus, the extended portion 3c of the heat conducting element 3 is expanding beyond the base 2a over the periphery of the base 2a. The heat conducting element 3 is heat-conductively attached on the rear side of the base 2a of the heat sink 2 for enabling the heat conduction. Particularly, the heat conducting element 3 and the base 2a are fixed together by plural screws not shown in the drawings. When clamps are used to attach a holder which holds an electronic element 4 to the heat sink 2, in place of the heating element in the illustrated embodiment, the heat conducting element 3 can be held between the electronic element 4 and the base 2a. Or, the heat conducting element 3 can be fixed to the base 2a by an adhesive agent which has high heat conductivity.

In the illustrated embodiment, plural radiation fins 6 made of aluminum are integrally formed on the extended portion 3c of the heat conducting element 3. The radiation fins 6 are designed to be cooled by exposure to the air blown out of the air fan 1 and discharged to the outside of the base 2a through spaces between each radiation fin 2b. The radiation fins 6 are positioned to surround the entire periphery of the radiation fins 2b of the heat sink 2, however, just two radiation fins 6, 6 are expediently shown in FIG. 1 for the better understanding. The number and the position of the radiation fins 6 can be arranged according to the position and the heating value of the heat sources.

In the illustrated embodiment, when the air fan is in operation, the air flows following the course as indicated by the arrow. As a result, the surfaces of the base 2a and plural radiation fins 2b of the heat sink 2 are cooled as they exposed to the flowing air. Simultaneously, the radiation fins 6 on the heat conducting element 3 are cooled as exposed to the air discharged from the heat sink 2, so that radiation is widely performed from the outer portion of the heat conducting element 3. Thus, the heat conducting element 3 forcibly conducts heat from the heating element to the extended portion 3c, and also toward the peripheral portion or the rim of the base 2a of the heat sink 2, which enhances radiation from the radiation fins 2b of the heat sink 2. According to this example, the radiation from the radiation fins 2b is substantially improved and the radiation efficiency increases compared with the conventional apparatus.

Figure 2:
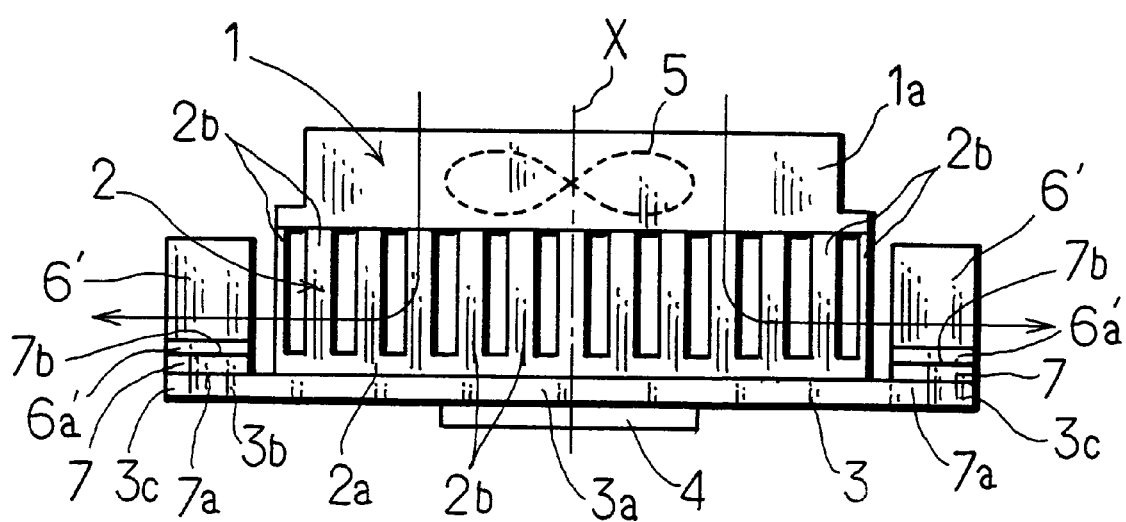
FIG. 2 is a schematic illustration showing a structure of another embodiment in accordance with the present invention.

FIG. 2 is a schematic view showing a structure of another embodiment in accordance with the present invention. In comparison with the embodiment shown in FIG. 1, the apparatus shown in FIG. 2 differs in the point that it includes semiconductor cooling elements 7 of a Peltier effect element between radiation fins 6' and the extended portion 3c of the heat conducting element 3. In the embodiment shown in FIG. 2, the elements also shown in FIG. 1 are bearing the same reference numerals as in FIG. 1 to omit the detailed description. In this embodiment, when the apparatus is electrically energized, the semiconductor cooling element 7, which absorbs heat from an endotheromic surface 7a and releases heat from a radiation heat surface 7b, is heat-conductively fixed or attached to the extended portion 3c to absorb heat from the extended portion 3c. One semiconductor cooling element 7 is provided for plural radiation fins 6', and each radiation fin 6' has a horizontal plane portion 6'a that fully contacts with the heat radiation surface 7b of the semiconductor cooling element 7. The semiconductor cooling element 7 is secured on the extended portion 3c of the heat conducting element 3 with the casing (not shown) of the semiconductor cooling element 7 threadedly fixed to the extended portion 3c by screws. The radiation fins 6' are fixed to the casing (not shown) of the semiconductor cooling element 7 by screws or by a bonding agent. Each semiconductor cooling element 7 is electrically energized through a lead wire (not shown). When a semiconductor cooling element 7 formed into a disc shape is used, plural radiation fins 6' can be positioned on a semiconductor cooling element 7.

Providing a semiconductor cooling element 7 between the radiation fins 6' and the heat conducting element 3 as shown in this embodiment results in increasing the value of the heat transfer performed by the heat conducting element 3. In this embodiment, the radiation fins 6' are cooled by the air blown out of the air fan 1, so that the heat radiation surfaces of the semiconductor cooling elements 7 are substantially cooled, which prevents decrease of the cooling effect of the semiconductor cooling element 7.

Figure 3:
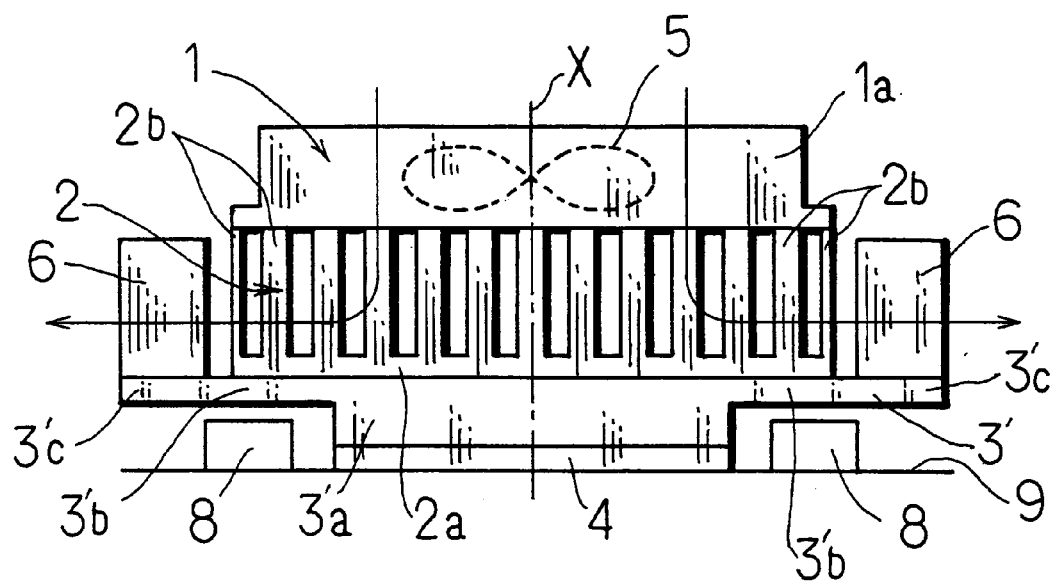
FIG. 3 is a schematic illustration showing a structure of another embodiment in accordance with the present invention.

FIG. 3 is a schematic view showing a structure of another embodiment in accordance with the present invention. In comparison with the embodiment shown in FIG. 1, the apparatus shown in FIG. 3 differs in the configuration of the heat conducting element 3'. In the embodiment shown in FIG. 3, the elements also shown in FIG. 1 are bearing the same reference numerals as in FIG. 1 to omit the detailed description. A heating element attached area 3'a of the heat conducting element 3', to which the electronic element 4 is conductively attached, is formed thicker than a heat element unattached area 3'b, and extends in the direction away from the base 2a of the heat sink 2. In this structure, a gap or a space having a size as large as the size of the extension of the heating element attached area 3'a and a size of the width of the electronic element 4 is provided under the heating element unattached area 3'b, on the opposite side of the base 2a. An electronic component 8 included in a circuit board 9 can be received in this gap for saving space of installation while improving the cooling efficiency of the cooling apparatus. In this embodiment, the apparatus can include semiconductor cooling elements 7 between radiation fins 6 and the extended portion 3'c of the heat conducting element 3'.

Figure 4:
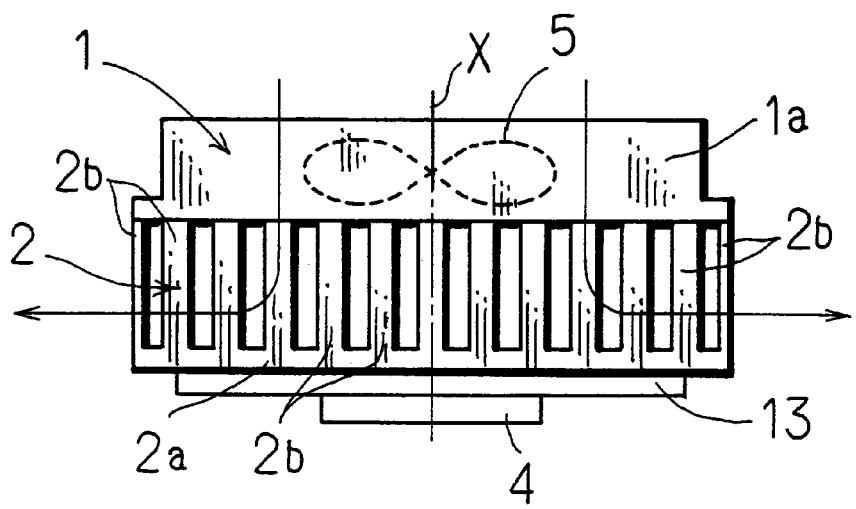
FIG. 4 is a schematic illustration showing a structure of another embodiment in accordance with the present invention.

FIG. 4 is a schematic view showing a structure of another embodiment in accordance with the present invention. In comparison with the embodiment shown in FIG. 1, the apparatus shown in FIG. 4 differs in the configuration of the heat conducting element 13, and the heat conducting element 13 is not provided with radiation fins. In the embodiment shown in FIG. 4, the elements also shown in FIG. 1 are bearing the same reference numerals as in FIG. 1 to omit the detailed description. In this embodiment, the heat conducting element 13 made of a copper plate has a configuration slightly smaller than that of the base 2a of the heat sink 2. In such a structure that the heat conducting element 13 is conductively provided between the electronic element 4 and the base 2a of the heat sink 2, the heat from the electronic element 4 can be conducted to the nearly outer edge of the base 2a through the heat conducting element 13, resulting in improving radiation efficiency or cooling efficiency.

In these embodiments described above, a copper plate is used as the heat conducting element 3, 3' or 13, however, a heat conducting element including a heat pipe construction which functions to uniform the temperature of the heat conducting element can be used. Adopting the heat conducting element including a heat pipe construction to these embodiments further improves the radiation efficiency or cooling efficiency. In the apparatus using the heat conducting element with a heat pipe construction, the semiconductor cooling element can also be used as the embodiment shown in FIG. 2.

In accordance with the present invention, the heat can be efficiently conducted from the heat source of the heating element to the peripheral portion of the heat sink through the heat conducting element. Thus, the heat radiation efficiency of the heat sink which is cooled by the air fan, or the cooling efficiency of the radiation fins can be increased. As the heat conducting element is intended to function to outwardly conduct the heat from the heating element toward the rim the base, the apparatus equipped with the heat conducting element has an advantage that it is capable of avoiding increase of excessive weight compared with the apparatus the heat sink of which is all formed by a material of high conductivity.

Also, the heat radiation effect in the outer portion of the heat conducting element can be enhanced by forming the extended portion of the heat conducting element which outwardly extends exceeding the base of the heat sink and providing plural radiation fins on the extended portion, resulting in further increasing the cooling efficiency of the cooling apparatus.

Adopting a heat conducting element having a heat pipe construction can further improve the cooling efficiency of the apparatus.

The entire disclosure of Japanese Patent Application No. 76734/1996, filed on Mar. 29, 1996, including specification, claims, drawings and summary are incorporated herein by reference in its entirety.

What is claimed is:

1. A heating element cooling apparatus comprising:
   a heating element;
   a heat sink having a base and a plurality of radiation fins, said base having a rear side and a front side, said radiation fins being on said front side of said base;

a heat conducting element of higher heat conductivity than said base being conductively attached on said rear side of said base;

said heating element being conductively attached to said heat conducting element;

said heat sink being adapted to cool said heating element by radiating heat generated by said heating element from said base and said radiation fins;

an air fan provided on said heat sink for blowing air towards said base of said heat sink and said radiation fins;

said air fan having an axis of rotation and being adapted to draw air from one side along said axis of rotation and to discharge air to another side along the axis of rotation and radial directions of the axis of rotation;

said air fan being positioned to oppose said heating element through said base;

said heat sink being constructed such that air discharged from said air fan flows out to the outside of said base while cooling a plurality of said radiation fins;

said heat conducting element being adapted to conducted heat generated by said heating element toward a rim of said base;

said heat conducting element having an extended portion, said extended portion extending outwardly and beyond said base of said heat sink; and, at least one radiation fin being provided on said extended portion extending into a path of said air discharged from the said air fan.

2. A heating element cooling apparatus as defined in claim 1, wherein said heat conducting element comprising a heating element attached area, to which said heating element is heat conductively attached, and a heating element unattached area, which includes said extended portion, positioned outside of said heating element attached area; and, said heating element attached area being thicker than said heating element unattached area, and extending in the direction away from said base of said heat sink.

3. A heating element cooling apparatus comprising:

a heating element;

a heat sink having a base and a plurality of radiation fins, said base having a rear side and a front side, said radiation fins being on said front side of said base;

a heat conducting element of higher heat conductivity than said base being conductively attached on said rear side of said base;

said heating element being conductively attached to said heat conducting element;

said heat sink being adapted to cool said heating element by radiating heat generated by said heating element from said base and said radiation fins;

an air fan provided on said heat sink for blowing air towards said base of said heat sink and said radiation fins;

said air fan having an axis of rotation and being adapted to draw air from one side along said axis of rotation and to discharge air to another side along the axis of rotation and radial directions of the axis of rotation;

said air fan being positioned to oppose said heating element through said base;

said heat sink being constructed such that air discharged from said air fan flows out to the outside of said base while cooling a plurality of said radiation fins;

said heat conducting element being adapted to conducted heat generated by said heating element toward a rim of said base;

said heat conducting element having an extended portion, said extended portion extending outwardly and beyond said base of said heat sink; and, a semiconductor cooling element, which absorbs heat from an endothermic surface and releases heat from a heat radiation surface when electrically energized, being heat-conductively attached to said heat conducting element extended portion to absorb heat from said heating element.

* * * * *

UNITED STATES PATENT AND TRADEMARK OFFICE
CERTIFICATE OF CORRECTION

PATENT NO. : 5,992,511
DATED : November 30, 1999
INVENTOR(S) : Kodaira et al.

It is certified that error appears in the above-indentified patent and that said Letters Patent is hereby corrected as shown below:

Column 1, Line 42, delete "liKe" and insert --like--.

Column 2, Line 17, delete "Preferable" and insert --preferable--.

Column 3, Line 32, delete "or" and insert --on--.

Column 3, Line 33, delete "carts" and insert --parts--.

Column 7, Line 32, Claim 1, delete "the".

Signed and Sealed this

Eighth Day of August, 2000

Attest:

Q. TODD DICKINSON

*Attesting Officer*         *Director of Patents and Trademarks*